United States Patent
Lai

(10) Patent No.: US 8,278,673 B2
(45) Date of Patent: Oct. 2, 2012

(54) LIGHT EMITTING DIODE AND METHOD FOR MAKING SAME

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 170 days.

(21) Appl. No.: 12/873,274

(22) Filed: Aug. 31, 2010

(65) Prior Publication Data
US 2011/0084298 A1 Apr. 14, 2011

(30) Foreign Application Priority Data

Oct. 13, 2009 (CN) .......................... 2009 1 0308244

(51) Int. Cl.
*H01L 33/00* (2010.01)
(52) U.S. Cl. ..... 257/95; 257/98; 257/103; 257/E33.068; 257/E33.074
(58) Field of Classification Search ............ 257/95, 257/98, 103, E33.068, E33.074
See application file for complete search history.

(56) References Cited

U.S. PATENT DOCUMENTS

| | | | |
|---|---|---|---|
| 6,323,059 B1 * | 11/2001 | Yoshida et al. | 438/106 |
| 7,306,964 B2 * | 12/2007 | Lee et al. | 438/48 |
| 2008/0142824 A1 * | 6/2008 | Chen et al. | 257/98 |

* cited by examiner

*Primary Examiner* — Minh-Loan T Tran
(74) *Attorney, Agent, or Firm* — Altis Law Group, Inc.

(57) ABSTRACT

A light emitting diode comprises a heat conductive layer, a semiconductor layer disposed above the heat conductive substrate and consisting of a p-type semiconductor layer, an active layer and an n-type semiconductor layer, a transparent electrode layer, a current blocking layer and an electrode contact pad. The p-type semiconductor layer has first concaves located on its surface distant from the active layer. The n-type semiconductor layer has second concaves located on its surface distant from the active layer. The transparent electrode layer is located on the surface of the n-type semiconductor layer except the second concaves. The current blocking layer is located in the first concaves of the p-type semiconductor layer. The electrode contact pad is located on the surface of the transparent electrode layer. The density of the second concaves decrease with distance from the electrode contact pad.

16 Claims, 12 Drawing Sheets

LIGHT EMITTING DIODE AND METHOD FOR MAKING SAME

BACKGROUND

1. Technical Field

The present disclosure is related to light emitting diodes, and particularly to a light emitting diode and method for making the same.

2. Description of Related Art

A light emitting diode (LED) is consisted of a p-type GaN layer, an n-type GaN layer and an active layer located between the p-type GaN layer and the n-type GaN layer.

The LED is lighting when a current flows through the active layer, therefore, the lighting efficiency of the LED is affected by the distribution of the current in the LED.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Figure 1:
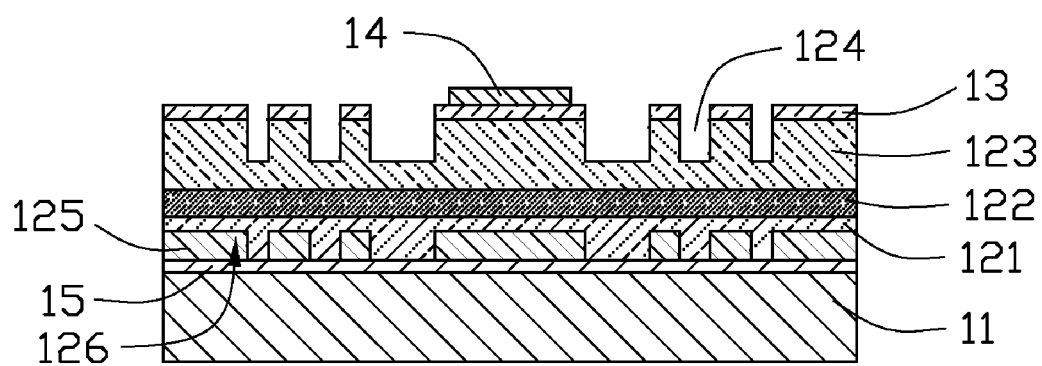
FIG. 1 is a cross-sectional view diagram of an embodiment of an LED.

Referring to FIG. 1, a light emitting diode (LED) includes a heat conductive substrate 11, a semiconductor layer, a transparent electrode layer 13 and an electrode contact pad 14. The semiconductor layer sequentially includes a p-type semiconductor layer 121, an active layer 122 and an n-type semiconductor layer 123.

The heat conductive substrate 11 is made of a material with high thermal conductivity. The substrate 11 can be made of copper, aluminum, nickel, silver, gold or similar alloys thereof. In addition, the substrate 11 can be a ceramic substrate such as a silicon or germanium substrate.

The p-type semiconductor 121, the active layer 122 and the n-type semiconductor layer 123 are sequentially stacked above the substrate 11. The semiconductor layer can be made of GaN, AlGaN or InGaN. In the embodiment, the semiconductor layer is made of GaN.

The p-type semiconductor layer 121 is located between the active layer 122 and the substrate 11, and has a plurality of first concaves 126. The first concaves 126 are formed on a surface of the p-type semiconductor layer 121 that the surface is distant from the active layer 122. A current blocking layer 125 is located in the first concaves 126, which is made of an insulation material such as silicon dioxide ($SiO_2$).

The n-type semiconductor layer 123 is attached to the active layer 122 which is distant from the p-type semiconductor layer 121, and has a plurality of second concaves 124. The second concaves 124 are formed on a surface of the n-type semiconductor layer 123 that the surface is distant from the active layer 122. In addition, a pattern formed by the first concaves 126 and a pattern formed by the second concaves 124 are complementary.

Figure 2:
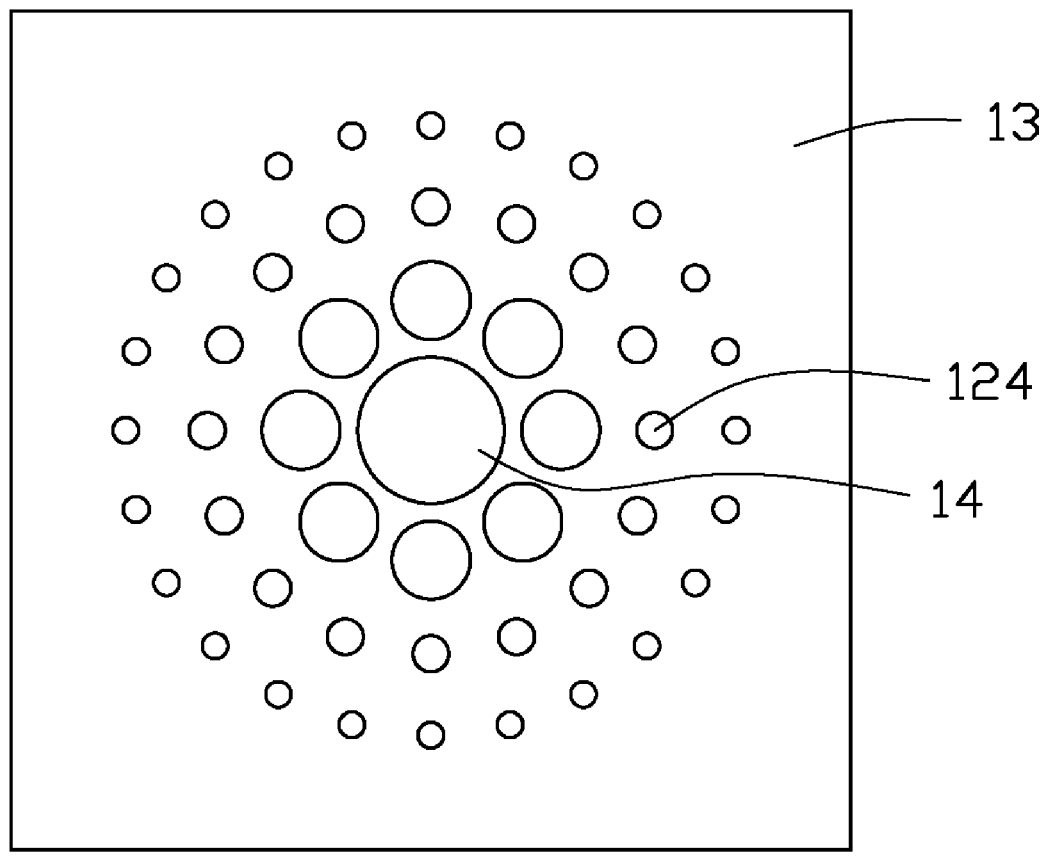
FIG. 2 is a top view of the LED of FIG. 1.

Referring to FIG. 2, the density of the second concaves 124 decreases with distance from the electrode contact pad 14. In other words, the resistivity also decreases with distance from the electrode contact pad 14 so that the current can be distributed uniformly in the LED to enhance the lighting efficiency.

The transparent electrode layer 13 is located on a surface of the n-type semiconductor layer 123. The transparent electrode layer 13 is made of indium tin oxide (ITO).

The electrode contact pad 14 is disposed on a surface of the transparent electrode layer 13 for connecting to a power supply. The electrode contact pad 14 is made of silver, gold, copper or aluminum. In the embodiment, the electrode contact pad 14 is located on a central surface of the transparent electrode layer 13.

In the embodiment, the second concaves 124 are located around the electrode contact pad 14 to form a pattern of concentric circles. In addition, the shape of each second concaves 124 is circular and the diameter of the second concave 124 decreases with distance from the electrode contact pad 14. In addition, the distance between each of the circles increases with distance from the electrode contact pad 14. The second concave 124 may also be equilateral triangle, square or hexagon, and the size of the concaves decreases with distance from the contact pad 14.

Due to the fact that the current-flow in the LED is by the active layer 122 to the p-type semiconductor layer 121 from the n-type semiconductor layer 123, the n-type semiconductor layer 123 needs to be attached to the active layer 122. In other words, the depth of the second concave 124 needs to be smaller than the thickness of the n-type semiconductor layer 123. In the embodiment, the depth of the second concave 124 is one third to two thirds of the thickness of the n-type semiconductor layer 123 to ensure the current can be distributed uniformly in the LED.

In addition, the current blocking layer 125 is for diffusing the current to distribute in the active layer 122 to enhance the lighting efficiency. In the embodiment, it is similar to the second concave 124, the thickness of the current blocking layer 125 is one third to two thirds of the thickness of the p-type semiconductor layer.

In the embodiment, the LED further includes a reflection layer 15 with high reflection rate such as a Bragg reflector. The reflection layer 15 can be made of silver, nickel, aluminum, copper or gold. The reflection layer 15 is located between the substrate 11 and the p-type semiconductor layer 121 to reflect the light emitted from the active layer 122 to enhance the lighting efficiency.

Referring to FIGS. 3A to 3I, a method for making the LED includes the following steps.

Figure 3A:
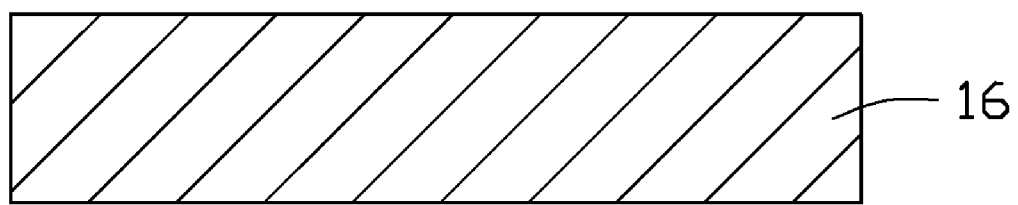
FIGS. 3A to 3J are cross-sectional view diagrams of an embodiment of a method for making the LED of FIG. 1.

A sapphire substrate 16 is provided as FIG. 3A.

Figure 3B:

Referring to FIG. 3B, an n-type GaN layer 123, an active layer 122 and a p-type GaN layer 121 are sequentially formed on the sapphire substrate 16 by the process of metal-organic chemical vapor deposition (MOCVD).

Figure 3C:
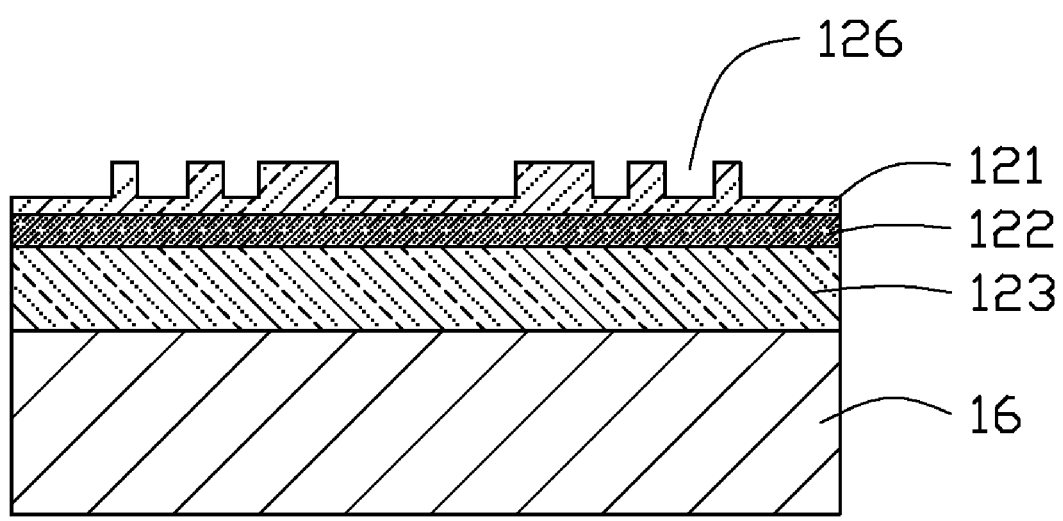

Referring to FIG. 3C, a plurality of first concaves 126 are formed on the p-type GaN layer 121 by an inductive couple plasma (ICP) etching system. The etching method further includes the following steps. A photoresist layer is applied on a surface of the p-type GaN layer 121; a part of the photoresist layer is striped by exposure and development process according to a pattern to expose a part of p-type GaN layer 121; and the exposed p-type GaN layer 121 is etched by an ICP etching system to form the first concaves 126.

Figure 3D:
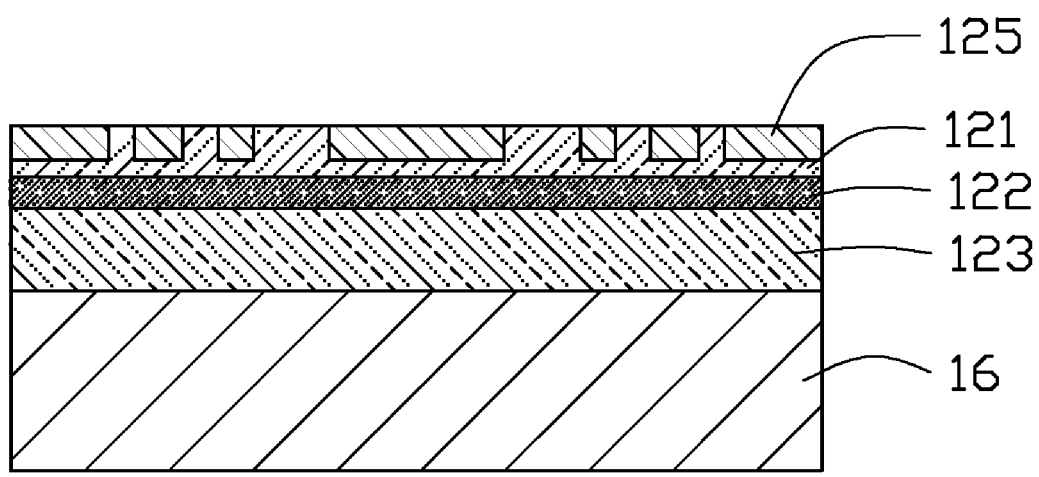
Figure 3E:
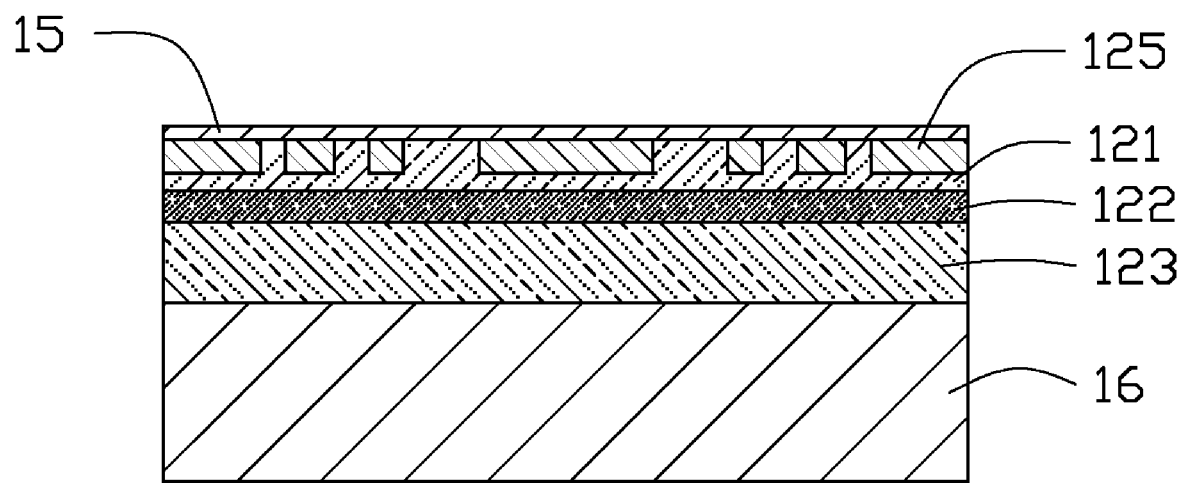

Referring to FIG. 3D, a silica material is deposited in the first concaves 126 to form a current blocking layer 125.

In addition, an orientation hole (not shown in the drawings) is formed by an ICP etching system. The orientation hole is formed from the p-type GaN layer 121 to the n-type GaN layer 123.

Referring to 3E, a reflection layer 15 is deposited on the p-type GaN layer 121 and the current blocking layer 125 for reflecting the light emitted from the active layer 122 to enhance the lighting efficiency. The reflection layer 15 can be made of silver, nickel, aluminum, copper or gold. In the embodiment, the reflection layer is made of silver, which can be deposited by an electron beam, sputtering, vacuum metalizing or electroplating.

Figure 3F:
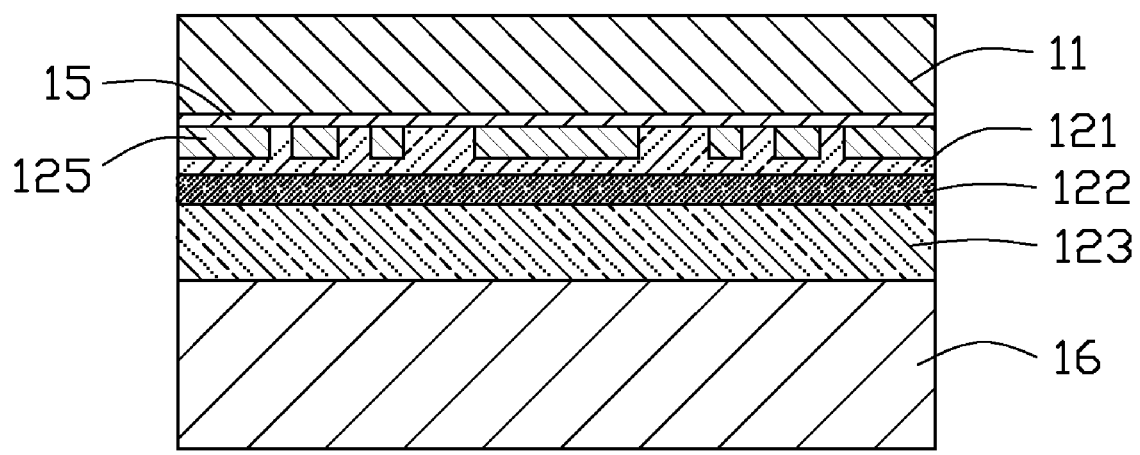

Referring to FIG. 3F, a heat conductive substrate 11 is connected to the p-type GaN layer 121 through the reflection layer 15. The substrate 11 can be a silicon substrate or a metal substrate, which is connected to the reflection layer 15 by high temperature and high pressure process. In addition, the substrate 11 can be formed by electroplating. In the embodiment, a nickel layer is electroplated on the reflection layer 15 to form the heat conductive substrate 11.

Figure 3G:
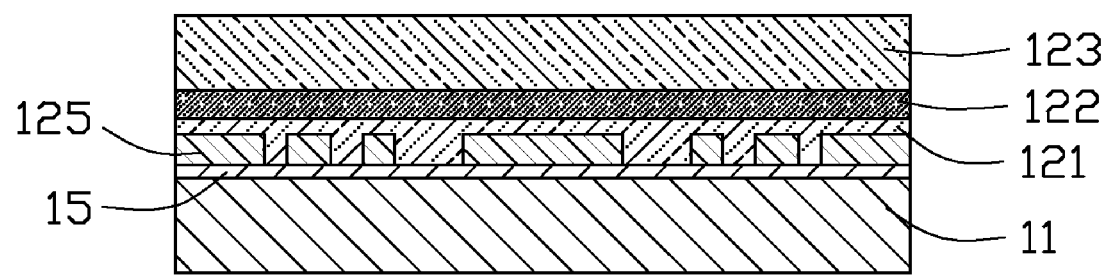

Referring to FIG. 3G, the sapphire substrate 16 is stripped from the n-type GaN layer 123. The substrate 16 can be stripped by mechanical cutting, electromagnetic radiation or laser cutting. In the embodiment, the substrate 16 is stripped from the n-type GaN layer 123 by excimer laser.

Figure 3H:
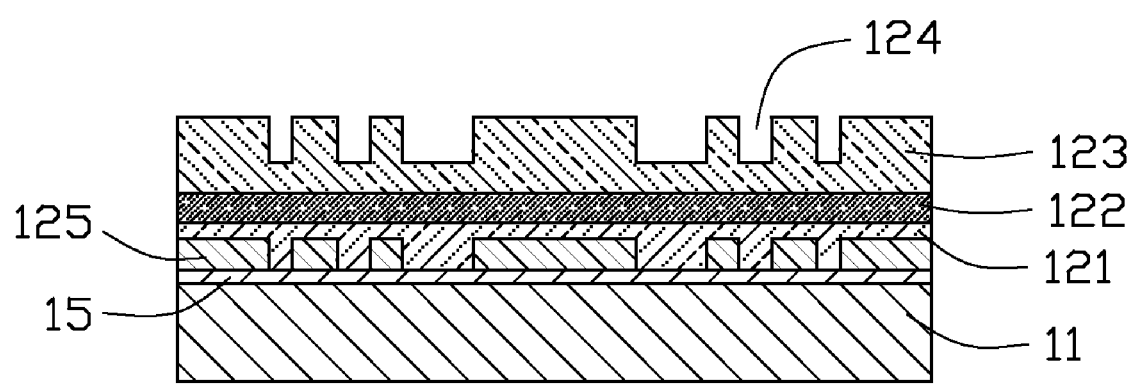

Referring to FIG. 3H, a plurality of second concaves 124 with different density and size are formed on the n-type GaN layer 123 by ICP. The orientation of the second concaves 124 can refer to the orientation hole in the ICP process.

Figure 3I:
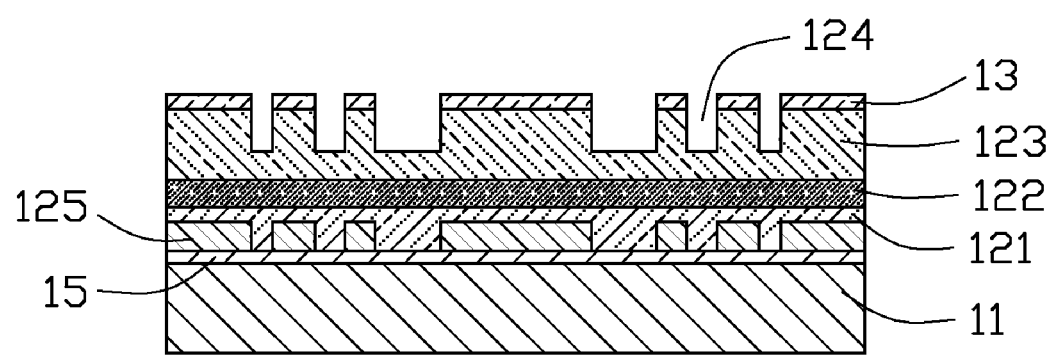

Referring to FIG. 3I, a transparent electrode layer 13 is deposited on the surface of the n-type GaN layer 123 except the second concaves 124.

Figure 3J:
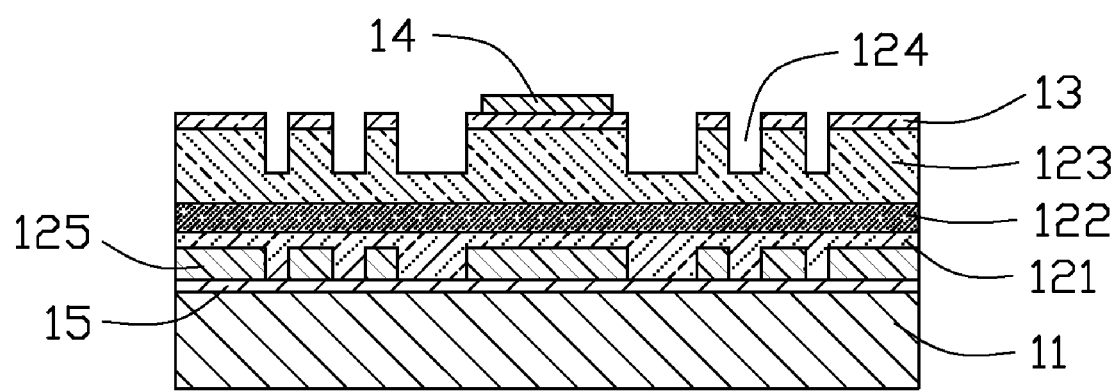

Referring to FIG. 3J, an n-type contact pad 14 is made on a surface of the transparent electrode layer 13 for electrically connecting to a power supply (not shown in the drawings).

It is to be understood, however, that even though numerous characteristics and advantages of certain inventive embodiments have been set out in the foregoing description, together with details of the structures and functions of the embodiments, the disclosure is illustrative only; and that changes may be made in detail, especially in matters of arrangement of parts within the principles of present invention to the full extent indicated by the broad general meaning of the terms in which the appended claims are expressed.

What is claimed is:

1. A light emitting diode, comprising:
a heat conductive substrate;
a semiconductor layer, which is disposed above the heat conductive substrate and sequentially has a p-type semiconductor layer, an active layer and an n-type semiconductor layer, the p-type semiconductor layer having a plurality of first concaves located on its surface distant from the active layer, the n-type semiconductor layer having a plurality of second concaves located on its surface distant from the active layer;
a transparent electrode layer, which is located on the surface of the n-type semiconductor layer except the second concaves;
a current blocking layer, which is located in the first concaves of the p-type semiconductor layer; and
an electrode contact pad, which is located on the surface of the transparent electrode layer,
wherein the density of the second concaves decrease with distance from the electrode contact pad.

2. The light emitting diode of claim 1, wherein the diameter of the second concaves decreases with distance from the electrode contact pad.

3. The light emitting diode of claim 1, wherein the electrode contact pad is located on a central surface of the transparent electrode layer.

4. The light emitting diode of claim 1, wherein the semiconductor layer is made of GaN, AlGaN or InGaN.

5. The light emitting diode of claim 1, further comprises a reflection layer located between the heat conductive substrate and the p-type semiconductor layer.

6. The light emitting diode of claim 1, wherein the current blocking layer is made of silicon dioxide ($SiO_2$).

7. The light emitting diode of claim 1, wherein the thickness of the current blocking layer is one third to two thirds of the thickness of the p-type semiconductor layer.

8. The light emitting diode of claim 1, wherein the depth of the second concave is one third to two thirds of the thickness of the n-type semiconductor layer.

9. A light emitting diode, comprising:
a heat conductive substrate;
a semiconductor layer, which is disposed above the heat conductive substrate and sequentially has a p-type semiconductor layer, an active layer and an n-type semiconductor layer, the p-type semiconductor layer having a plurality of first concaves located on its surface distant from the active layer, the n-type semiconductor layer having a plurality of second concaves located on its surface distant from the active layer;
a transparent electrode layer, which is located on the surface of the n-type semiconductor layer except the second concaves;
a current blocking layer, which is located in the first concaves of the p-type semiconductor layer; and
an electrode contact pad, which is located on the surface of the transparent electrode layer,
wherein the density of the second concaves decrease with distance from the electrode contact pad.

10. The light emitting diode of claim 9, wherein the density of the second concaves decreases with distance from the electrode contact pad.

11. The light emitting diode of claim 9, wherein the electrode contact pad is located on a central surface of the transparent electrode layer.

12. The light emitting diode of claim 9, wherein the semiconductor layer is made of GaN, AlGaN or InGaN.

13. The light emitting diode of claim 9, further comprises a reflection layer located between the heat conductive layer and the p-type semiconductor layer.

14. The light emitting diode of claim 9, wherein the current blocking layer is made of silicon dioxide ($SiO_2$).

15. The light emitting diode of claim 9, wherein the thickness of the current blocking layer is one third to two thirds of the thickness of the p-type semiconductor layer.

16. The light emitting diode of claim 9, wherein the depth of the second concave is one third to two thirds of the thickness of the n-type semiconductor layer.

* * * * *